United States Patent [19]

Owens et al.

[11] Patent Number: 4,830,623
[45] Date of Patent: May 16, 1989

[54] CONNECTOR ARRANGEMENT FOR ELECTRICALLY INTERCONNECTING FIRST AND SECOND ARRAYS OF PAD-TYPE CONTACTS

[75] Inventors: Mark J. Owens, Vernon; Scott S. Simpson, Woodstock, both of Conn.

[73] Assignee: Rogers Corporation, Rogers, Conn.

[21] Appl. No.: 154,197

[22] Filed: Feb. 10, 1988

[51] Int. Cl.⁴ .................................. H01R 23/72
[52] U.S. Cl. ............................ 439/71; 439/67
[58] Field of Search .................. 439/70–83, 439/259, 260, 264, 329, 330, 331; 361/395, 400, 403

[56] References Cited

U.S. PATENT DOCUMENTS

| | | | |
|---|---|---|---|
| Re. 31,114 | 12/1982 | Berg | 439/71 |
| 1,610,555 | 12/1926 | Kindl | 200/242 |
| 3,173,737 | 3/1975 | Kinkaid et al. | 439/637 |
| 3,356,983 | 12/1967 | Johnson | 439/67 |
| 3,582,865 | 6/1971 | Franck | 439/67 |
| 3,587,031 | 6/1971 | Flavin | 439/260 |
| 3,597,660 | 8/1971 | Jensen | 439/59 |
| 3,701,964 | 10/1972 | Cronin | 439/45 |
| 3,745,509 | 7/1973 | Woodward | 439/76 |
| 3,873,173 | 3/1975 | Anhalt | 439/71 |
| 3,999,826 | 12/1976 | Yurtin | 439/495 |
| 4,092,057 | 5/1978 | Walton | 439/67 |
| 4,116,517 | 9/1978 | Selvin | 439/67 |
| 4,164,003 | 8/1979 | Cutchaw | 439/67 |
| 4,169,642 | 10/1979 | Mouissie | 439/67 |
| 4,330,163 | 5/1982 | Aikens | 439/71 |
| 4,392,700 | 7/1983 | Showman | 439/260 |
| 4,420,203 | 12/1983 | Aug | 439/71 |
| 4,511,197 | 4/1985 | Grabbe | 439/71 |
| 4,540,227 | 9/1985 | Faraci | 439/64 |
| 4,552,420 | 11/1985 | Eigenbrode | 439/67 |
| 4,553,192 | 11/1985 | Babuka et al. | 439/66 |
| 4,602,317 | 7/1986 | Rovnyak et al. | 439/64 |
| 4,626,056 | 12/1986 | Andrews, Jr. | 439/260 |
| 4,629,270 | 12/1986 | Andrews, Jr. | 439/260 |
| 4,636,019 | 1/1987 | Gillett | 439/62 |
| 4,647,125 | 3/1987 | Landi | 439/67 |
| 4,655,524 | 4/1987 | Etzel | 439/71 |
| 4,690,472 | 9/1987 | Elco | 439/67 |
| 4,695,258 | 9/1987 | Hanson | 439/67 |
| 4,717,345 | 1/1988 | Gordon et al. | 439/632 |

OTHER PUBLICATIONS

Abbatecola et al., *IBM Technical Disclosure Bulletin* (Mar. 1968) vol. 10, No. 10, p. 1462.
Connecting Devices Bulletin, Oct. 1976 (3 pages) Hughes Aircraft Co.
RSS ™ Rogers Solderless System for Interconnections, Copyright 1979, Rogers Corporation.
(List continued on next page.)

*Primary Examiner*—Neil Abrams

[57] ABSTRACT

An electrical connector system for electrically interconnecting an integrated circuit chip unit having a plurality of arrays of first contacts arranged in a first pattern of peripheral form with a circuit board having a plurality of planar arrays of second contact pads arranged in a second pattern of peripheral form. The connector system includes a module member adapted to support the integrated circuit chip unit over the pattern of the circuit board, a plurality of rigid contact carrier members, and a plurality of multi-conductor flexible circuit structures extending between respective portions of the first and second peripheral patterns. Each flexible circuit structure has one ends of its conductors on the module member for electrical connection to respective contacts of the integrated circuit chip unit and the other ends of each flexible circuit structure secured to a corresponding contact carrier member with contact pads at those other conductor ends for electrical connection to corresponding contact pads of the circuit board. Each flexible circuit structure is in disposed within the interior of the connector system in an inwardly bowed configuration in which the flexible circuit structures extend inwardly from the peripheral patterns. A unitary clamping device causes movement of each of the contact carrier structures inwardly relative to the peripheral patterns on the circuit board to produce wiping during connecting motion.

36 Claims, 17 Drawing Sheets

OTHER PUBLICATIONS

Burke, "Flex Circuit Zero Insertion Force Connector", *IBM Technical Disclosure Bulletin,* vol. 26, No. 12 (May 1984), p. 6657.

Mersereau, Rogers Solderless System, Proceedings of the Fourth International Electronics Packaging Conference, Oct. 1984, pp. 43–53.

Gordon, *Backplane Interconnection System,* presented at International Electronic Packaging Society Symposium, San Diego, California (Nov. 1986).

Simpson et al., *Connector with High Contact Density and Controlled Impedance.*

Lockard, "System Approach to High-Speed Digital Packaging", reprinted from *Electronics Packaging and Production* (Sep. 1986).

"A New Generation in Interconnection Technology", Augaut/Microtec, dated 9/84.

CONNECTOR ARRANGEMENT FOR ELECTRICALLY INTERCONNECTING FIRST AND SECOND ARRAYS OF PAD-TYPE CONTACTS

This invention relates to electrical circuit interconnections, and more particularly to connector arrangements of the type that are particularly useful with electronic circuit components of the semiconductor type.

Integrated circuitry developments require circuit interconnection configurations of greater density, as well as circuit path configurations that control impedance and resistive effects which may alter circuit performance Conventionally employed methods of interconnecting electrical or electronic circuit components have included the "pin and socket" type and the so-called "zero force insertion" type in which a circuit card may be inserted when cooperating contacts are in an open position, and the contacts are then cammed to a closed position. These and other techniques have required substantial space or generally have a tendency to utilize complex arrangements and complicated manufacturing procedures. Additionally, certain types of commercially employed connectors cannot be easily matched in impedance to the circuit cards being connected, thus causing reflections which degrade signal quality. Such problems are particularly acute when connectors are used with newer generation semiconductors which have high switching speeds (100-500 picosecond rise time), low switching energy and signal swings in the microvolts range, the resulting disadvantages including poor signal quality caused by high crosstalk, rise time degradation, and reflections due to impedance mismatch. An improved but somewhat complex electrical connector system is disclosed in copending application Ser. No. 864,786 filed May 19, 1987 and entitled ELECTRICAL CIRCUIT INTERCONNECTION.

In accordance with one aspect of the invention, there is provided an electrical connector system for electrically interconnecting an integrated circuit chip unit having a plurality of arrays of first contacts arranged in a first pattern with a circuit board having a plurality of planar arrays of second contact pads arranged in a second pattern, each pattern being of peripheral form. The connector system includes a module member adapted to support the integrated circuit chip unit generally over the pattern of the circuit board, a plurality of multi-conductor flexible circuit structures extending between respective portions of the first and second peripheral patterns, each flexible circuit structure having one ends of its conductors disposed on the module member for electrical connection to respective contacts of the integrated circuit chip unit and contact pads at the other ends of its conductors for electrical connection to corresponding contact pads of said circuit board, a plurality of rigid nonconductive contact carrier structures, the other ends of each flexible circuit structure being secured to a corresponding contact carrier member. Each flexible circuit structure is in disposed within the interior of the connector system in an inwardly bowed configuration in which the flexible circuit structure extends from the respective ends inwardly from the peripheral patterns. A device that causes movement relative to the circuit board of each of the contact carrier structures of contact pads to produce wiping during connecting motion is adapted to move the contact carrier structures inwardly relative to the peripheral pattern on the circuit board during the wiping motion.

Preferably, the pad arrays on the flexible circuit structures include a ground plane pad and an array of pads for signal traces, the ground plane pad being closest to the ends of the flexable circuit structure thereby to correspond to the exterior of the peripheral pattern of pads on the module member.

In accordance with another aspect of the invention, there is provided, a high frequency electrical connector system for electrically interconnecting an integrated circuit chip unit having a plurality of planar arrays of first contact pads arranged in a first pattern with a circuit board having a plurality of planar arrays of second contact pads arranged in a second pattern. The system includes a module member adapted to receive the integrated circuit chip unit, a plurality of multi-conductor flexible circuit structures, each flexible circuit structure having one ends of its conductors disposed on the module member for electrical connection to respective contact pads of said integrated circuit chip unit and contact pads at the other ends of its conductors for electrical connection to corresponding contact pads of the circuit board, a plurality of rigid nonconductive contact carrier structures, the other ends of each flexible circuit structure being secured to a corresponding contact carrie member. Each carrier structure includes a driven portion, a plurality of actuator portions cooperate with the driven portions, the module member is resiliently coupled to the carrier structures with the actuator portions adjacent the driven portions, and unitary clamp structure is operable, with respective ones of the contact pad arrays of the flexible circuit structures and the circuit board in face-to-face engagement, to move the module member towards the circuit board in clamping movement. The clamping movement causes interaction of the actuator mechanisms and the driven portions to produce lateral movements of the contact carrier structures in directions parallel to the planes of the contact arrays of the flexible circuits and circuit board in wiping actions.

In preferred embodiments, the resilient contact array mounting structures are resilient sheet members having low stress relaxation when in compression that is carried by the contact carrier structure. Both the resilient elastomeric coupling structure and the resilient contact array mounting structure may be of foam-type material, such material preferably having a density in the range of 2-50 pounds per cubic inch, and an air or cell volume in the range of about 25-95 percent, the foam-type material having a compression set, tested by ASTM Test Standard D3574 of less than ten percent compression set after 22 hours at 158° F. at 50 percent compression with one half hour recovery. Such foam material is preferably selected from the group consisting of urethanes, silicones, natural rubbers, copolymers of butadiene-styrene, butadiene-acrylonitrile, butadiene-isobutylene, chloroprene polymers, polysulfide polymers, plasticized vinyl chloride, and acetate polymers and copolymers, and is in sheet form and has a thickness of less than one half centimeter.

In accordance with still another aspect, there is provided a connector subassembly with frame structure that includes a drive portion, contact carrier structure adapted to receive a circuit which has an array of pad-type contacts corresponding to pad-type contacts of a second array and that includes a driven portion, actuator mechanism disposed between said drive and driven portions, resilient structure interconnecting the frame structure and the contact carrier structure in a manner allowing guided movement of the frame structure towards the contact carrier structure, first guide structure associated with the frame structure for allowing the guided movement of the frame structure towards the contact carrier structure such that the actuator mechanism increases the lateral spacing between the drive and driven portions, and second guide structure associated with the contact carrier structure and allowing translational movement of the contact carrier structure relative to the frame structure while maintaining the pad-type contacts of said first and second circuits in alignment to produce lateral movement of the contact carrier structure parallel to the plane of the pad-type contacts in wiping action.

In one embodiment, the actuator mechanism includes a rigid plate member; and in another embodiment, the actuator mechanism includes a resilient spring member that is disposed between the drive and driven portions.

In embodiments, the connector subassembly includes a plurality of contact carrier structures with the contact carrier structures being arranged in about a central area, and common clamp structure is operable to move the contact carrier structures inwardly towards the central area in wiping actions.

Preferably, the flexible circuits are of transmission line type and include a plurality of conductor traces with terminal pads at one end spaced less than one hundred mils on center, and at least one ground plane, the conductor traces having the same characteristic impedance and being impedance matched to circuits being interconnected.

Other features and advantages of the invention will be seen as the following description of a particular embodiments progresses.

DESCRIPTION OF PARTICULAR EMBODIMENTS

DETAILED DESCRIPTION

Figure 1:
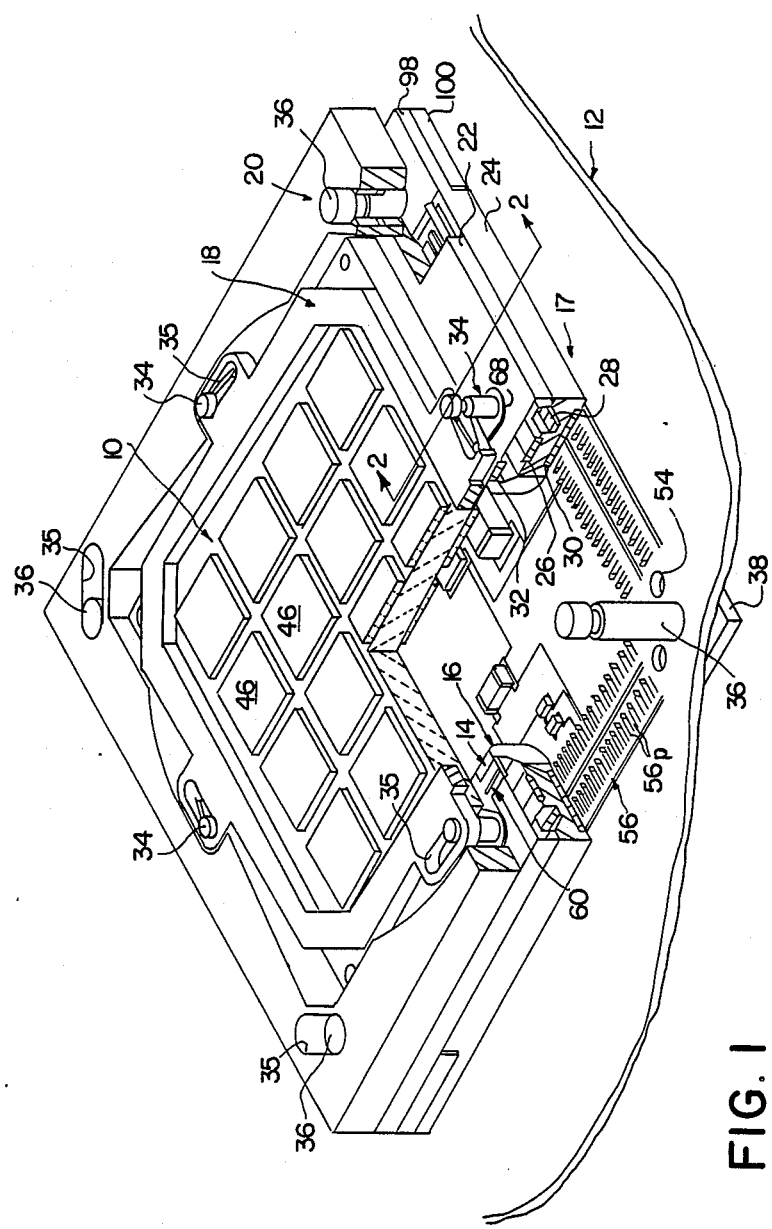
FIG. 1 is an isometric view with portions broken away of a connector assembly in accordance with the invention.

Shown in FIG. 1 is a connection system for connecting a multi-chip module 10 to a printed circuit board 12. This connection system utilizes a rectangular array of four pairs of flexible circuits 14 and 16, with support subassembly 17, module clamp plate 18 and assembly clamp plate 20. The support subassembly 17 includes module base plate 22 and four circuit blocks 24. Secured between each circuit block 24 and module base plate 22 are silicone foam strip 26 and an actuator plate 28, one actuator plate 28 per circuit block 24. On the bottom of each circuit block 24 is another silicone foam strip 30 which is used to generate contact force between contact pads 56 on flex circuits 14, 16 and contact pads on printed circuit board 12. On top of module base plate 22, in slots along its inside edge, are four silicone foam strips 32. One end of each flex circuit 14, 16 is secured to the top of module base plate 22 with the silicone foam strip 3 underneath its contact pads and its other end is secured to the bottom of a corresponding circuit block 24 against a silicone foam strip 30. This connector system is designed to complete pressure-mated electrical circuits between pads 60 on one end of each flex circuit 14, 16 with contact pads on module 10 without wipe, and wiping connections between contact pads on the other end of each flex circuit 14, 16 and contact pads 56 on the printed wiring board 12.

The pads 60P at the non-wiping end of each flex circuit 14, 16 can be connected at very high density. In a particular embodiment, the spacing of contact pads on module 10 is 0.012 inch center to center spacing and the center to center spacing of contacts 56P for the wiping connections on the printed wiring board 12 is 0.025 inch.

Figure 2A:
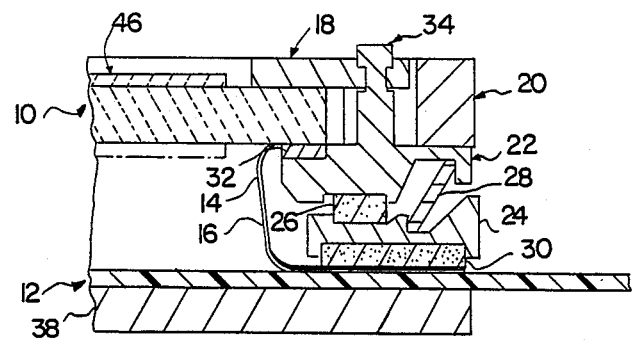
FIG. 2A is a cross-section view generally taken alone line 2—2 of FIG. 1 showing a portion of the connector assembly in unclamped condition.
Figure 2B:
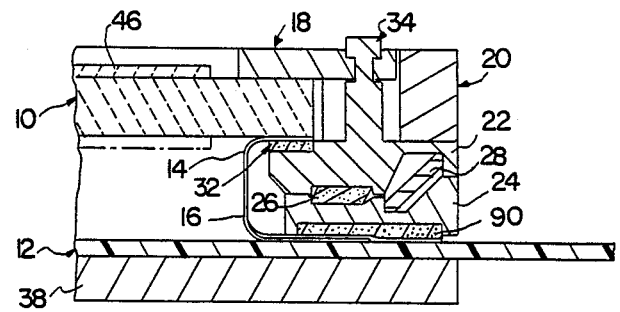
FIG. 2B is the connector assembly similar to the same view of FIG. 2A in clamped condition.
Figure 3:
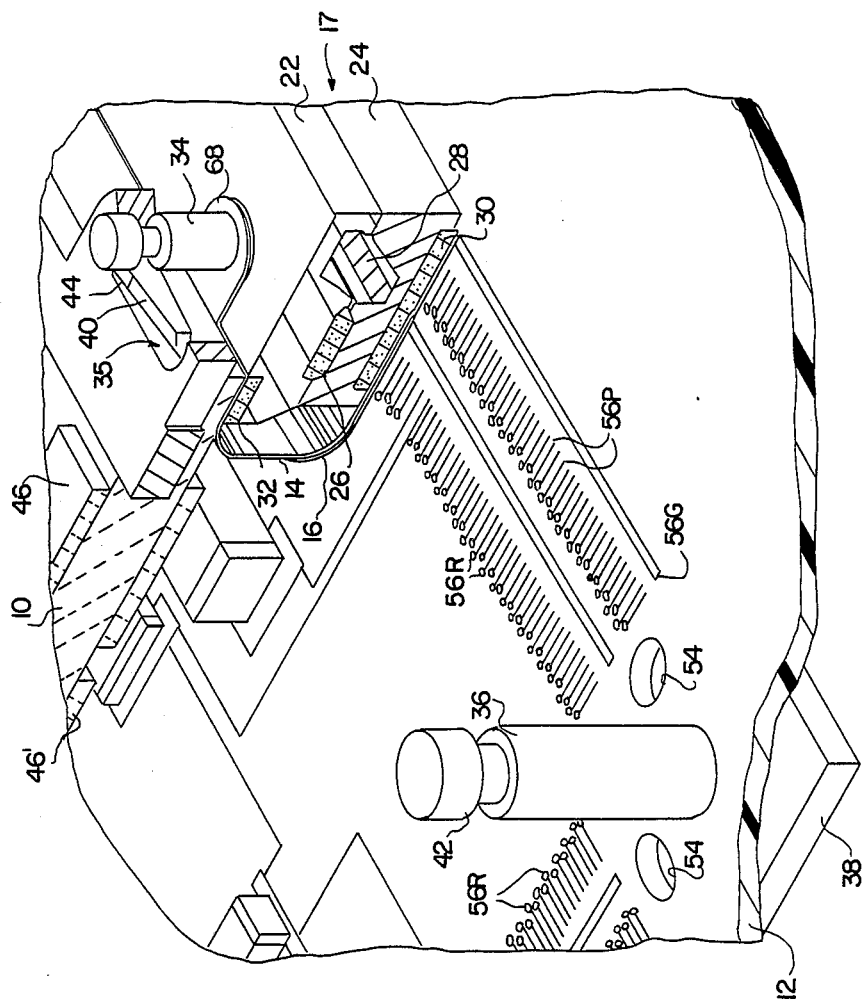
FIG. 3 is an enlarged view of a portion of FIG. 1.

The mechanism used to create wiping motion of flex circuit contact pads with pads 56 on the printed circuit board surface is shown in FIGS. 2A and 2B. FIG. 2A shows the clamped position of multi-chip module 10 on module base plate 22 and the cross-section of assembly components in an unclamped position with actuator plate 28 mounted between module base plate 22 and circuit block 24; and FIG. 2B shows the cross-section of assembly components in a clamped position. Contact pads on module 10 are in contact with the contact pads 60 on the flex circuits 14 and 16 and the silicone foam piece 32 is compressed beneath the flex circuits 14, 16, with the module 10 on top and the module base plate 22 underneath, to create the contact force for the module contact pad connection. The clamping force is generated by the module clamping plate 18 as a result of engagement with the module connection posts 34 in the module base plate 22. The mechanism which creates this clamping force is shown in a cut-away view in FIG. 3, which is an enlarged view of a portion of from FIG. 1, showing the module base plate 22 with upstanding post 34 and a cut-away view of a ramp surface 40 in the module clamp plate 18. The ramp and post clamping mechanism is shown in more detail in FIGS. 3A, B, C and D. Ramp and post mechanisms are used both to clamp the multi-chip module 10 to the module base plate 22 and also to clamp subassembly 17 onto the printed circuit board 12 by using assembly clamp plate 20.

Figure 3A:
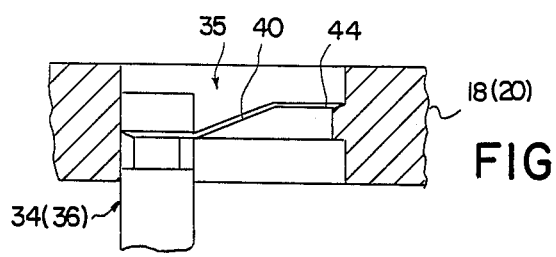
FIGS. 3A, 3B and 3C are diagrammatic views showing aspects of the mechanism for generating clamping force employed in the connector assembly of FIG. 1 showing the mechanism unclamped, during clamping and clamped, respectively

Both the module clamping plate 18 and assembly clamp plate 20 include elongated slots 35 with ramp surfaces 40 that interact with the shoulders 42 of posts 34 of the module base plate 22 and shoulders 42 of posts 36 of backplate 38 (FIG. 2A). Each ramp 40 of plates 18 and 20 has dual angles (lateral and longitudinal tapers) that interact with the angled shoulder portion 42 of posts 34 and 36. The relationships between unclamped and clamped stages for both the module clamping plate 18 and assembly clamping plate 20 are shown in FIGS. 3A, B and C; and FIG. 3D (a cross-sectional view of FIG. 3C) shows the relationship of posts 34 and 36 to the clamp plates 18 and 20 in the clamped position and also shows the laterally inclined aspects of ramp portions 40 and latch portion 44, the longitudinal ramp portions 40 of plates 18 and 20 being at the same angle as the shoulder angle portions 42 of each post 34, 36. During clamping of either of these assemblies, the posts slide smoothly along the ramps.

In the particular embodiment shown here, the angles of both the beveled portions 42 of posts 34 and 36, and portions 40, 44 of clamp plates 1 and 20 are all provided with 20° angles to the horizontal.

Figure 3B:
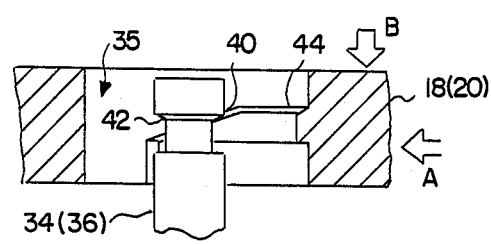
Figures 3C, 3D:
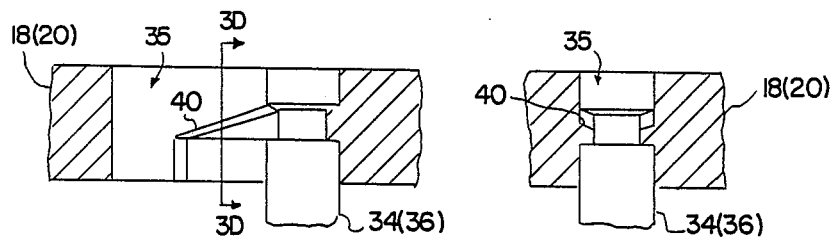
FIG. 3D is a section view of this clamping mechanism taken along the line 3D—3D of FIG. 3C.

In FIG. 3B, arrow A indicates lateral motion of clamp plate 18 or 20 during the clamping interaction of surfaces 40. 42 and 44. Motion A generates downward motion B of the clamp plates 18 and 20. The relationship of motion A to motion B is the same for both module clamp plate 18 and assembly clamp plate 20. The downward motion B is 0.060 inch in both cases while the linear motion A is about 0.110 inch.

Figure 4:
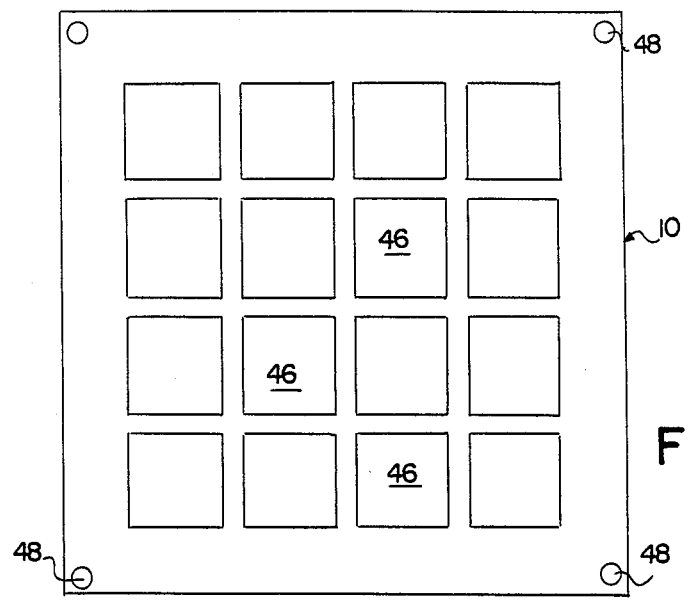
FIG. 4 is a top view of a multi-chip module to be connected using this embodiment.
Figure 5:
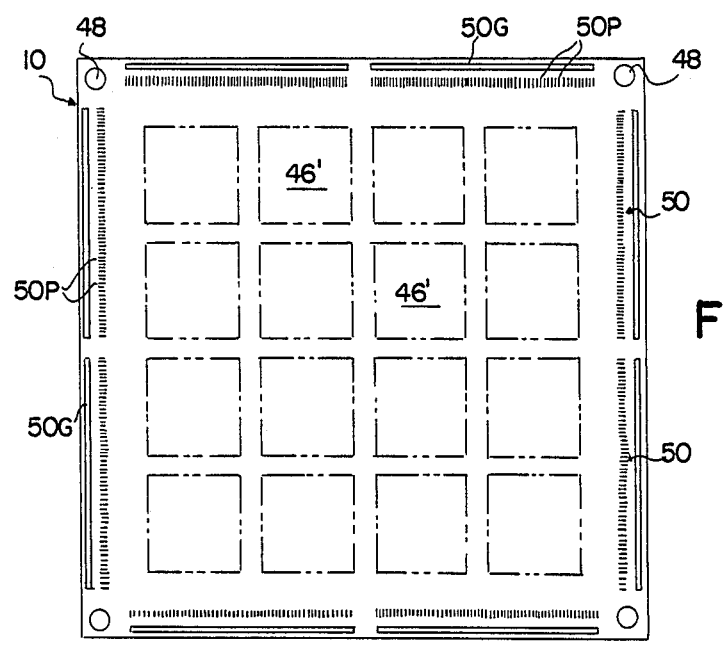
FIG. 5 is a bottom view of the multi-chip module of FIG. 4.

FIG. 4 is a top view of multi-chip module 10 showing, for example, sixteen chips 46 of an arbitrary size. In this case the module is three inches on the side and has a 0.096 inch diameter hole 4 in each corner. FIG. 5, a bottom view of multi-chip module 10, shows in phantom lines the position of additional chips 46' that can be mounted on the bottom side of module 10. The connection system thus provides space for chips or other components on the bottom side of module 10 as well as on its top side. There is space to put components on the top surface of the printed circuit board 12 in its center region, as well. In addition, FIG. 5 shows contact pad arrays 50. There are two groups of contact pad arrays on each side of the module for a total of eight contact pad arrays 50. These contact pad arrays mate with one end of each of the flex circuits 14 and 16. Each of these contact pad arrays 50 have one hundred contact pads 50P for signals at 0.012 inch centers and a ground strip connection 50G. The ground strip connection 50G is located to the outboard side of the module 10, providing a significant convenience in routing as it is significantly more convenient to have the signal pads 50P on the inboard side of the ground strip connection 50G.

Figure 6:
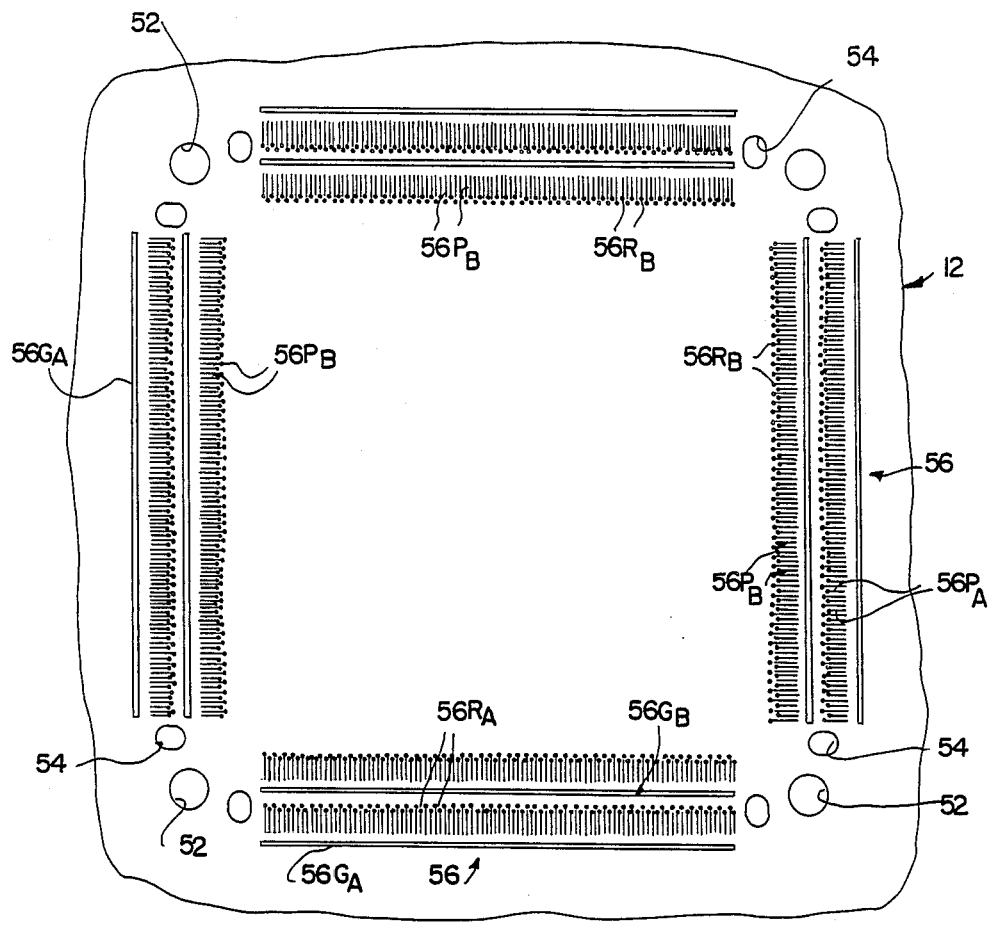
FIG. 6 is a top view of a portion of the printed circuit board showing contact pads to which components of the module are to be connected.

FIG. 6 is a top plan view of the printed circuit board 12 and shows four contact pad arrays 56, one on each side of a square shape. In the corners between each contact pad array 56 is an alignment hole 52 which fits over backplate clamp posts 36, not shown in this drawing. There are also slots 54 used to allow space for the circuit mounting posts 58, not shown in this drawing, see FIG. 13. Each contact array 56 consists of two rows of contact pads 56P and two ground contact strips 56G. The order from inboard to outboard is a row of contact pads $56P_B$, a ground strip $56G_B$, a second row of contact pads $56P_A$ and a further ground strip $56G_A$. There are a hundred contact pads 56P in each row at 0.025 inch center to center spacing. In addition to the inboard side of each row of contact pads, there are circular pads 56R for plated-through-holes to bring the signals from the contact pads 56P to internal circuit layers of the board 12. These contact pads 56R are offset in an alternating array to minimize the space consumed. The clearance holes 52 for the backer plate mounting posts 36 are 0.206 inches in diameter, and the slots 54 for clearance of the circuit mounting posts 58 are 0.025 inch wide by 0.116 inch long.

Figure 7A:
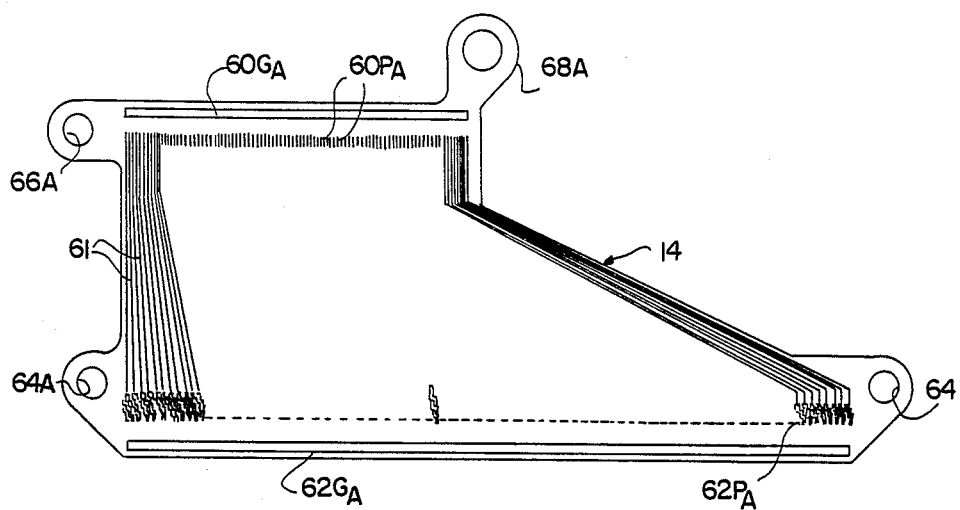
FIGS. 7A and 7B are diagrammatic views of left hand and right hand flexible circuits, respectively, used in the connector assembly of FIG. 1.
Figure 7B:
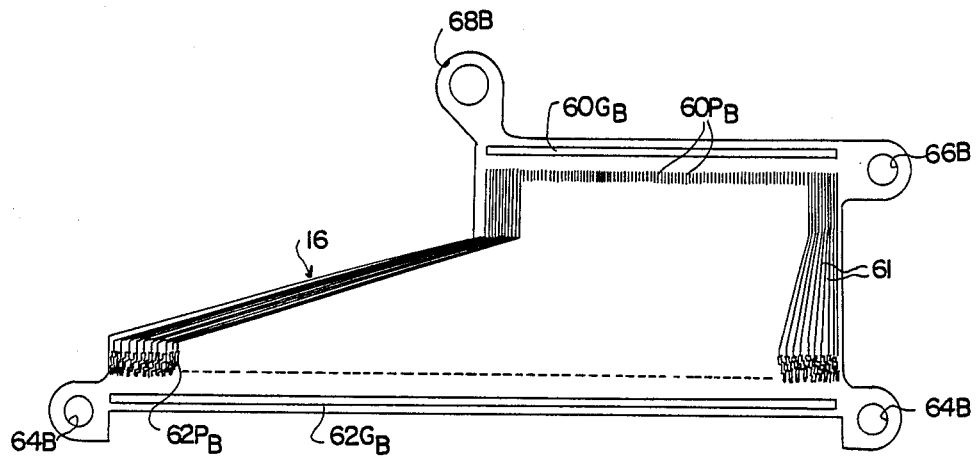

FIGS. 7A and 7B show flex circuits 14 and 16 of which two are used per side of the four-sided module, for a total of eight. These circuits have contact arrays 60, 62 at each end with traces 61 connecting the contact pads. At the narrow end of each circuit 14, 16 is contact array 60 which mates with contact array 50 on the multi-chip module 10 and at the wide end is contact array 62 which mates with part of the contact array 56 on the printed wiring board 12. Flex circuit 16, which is shown in 7B, is shorter than flex circuit 14 so that contact arrays 62B are offset slightly at the board end to overlap, and array 62A matches with one half (56A) of contact pad array 56 and array 62B matches with the other half (56B). At one side of the narrow end of each flex circuit 14, 16, facing outboard of the contact array is a tab 68 which has a 0.125 inch diameter hole designed to press fit over the post 34 in the module plate 22, and at each end of the narrow end of each flex circuit 14, 16 is a tab with a 0.094 inch hole 66 which is designed to press fit over module alignment posts 70 in the module base plate 22. At each end of the wide end of each circuit 14, 16 is a similar tab which contains a 0.094 inch diameter hole 64 which is designed to press fit over circuit block mounting posts 58 which are shown in FIG. 11.

Figure 8:
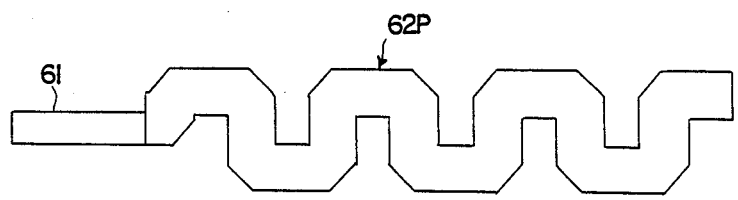
FIG. 8 is an enlarged plan view of a crenellated contact pad on the flex circuits of FIG. 7.

FIG. 8 shows an enlarged plan view of a crenellated contact pad 62P of contact array 62, that is used on the wide ends of the flex circuits 14, 16. This is the subject of pending application Ser. No. 109,292, filed Oct. 15, 1987 and are designed to produce better quality connections in concert with the wiping action generated by this hardware. The contact pads 56P on the printed wiring board 12 for which these crenellated contacts 62P are to be connected are plain rectangular pads 0.100 inch long by 0.010 inch wide. The contact pads 60P at the narrow ends of the flex circuits 14, 16 are 0.050 inch long and approximately 0.006 inch wide at 0.012 inch center to center spacing, the same pad spacing that is on module 10.

Figure 9A:
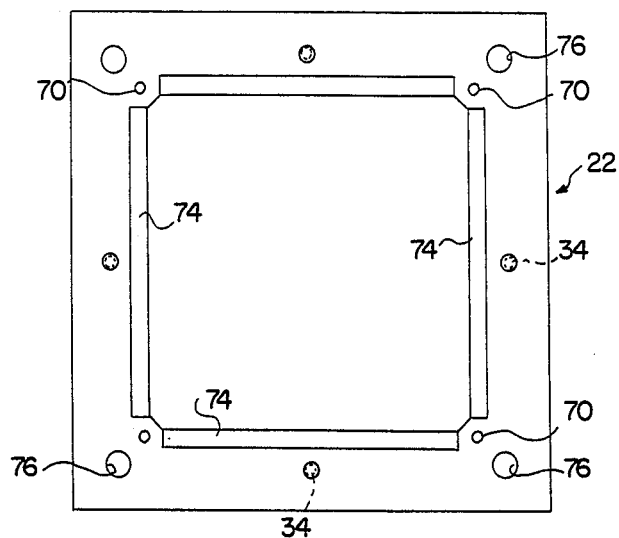
FIGS. 9A and 9B are top and bottom views, respectively, of the module plate used in the connector assembly of FIG. 1.
Figure 9B:
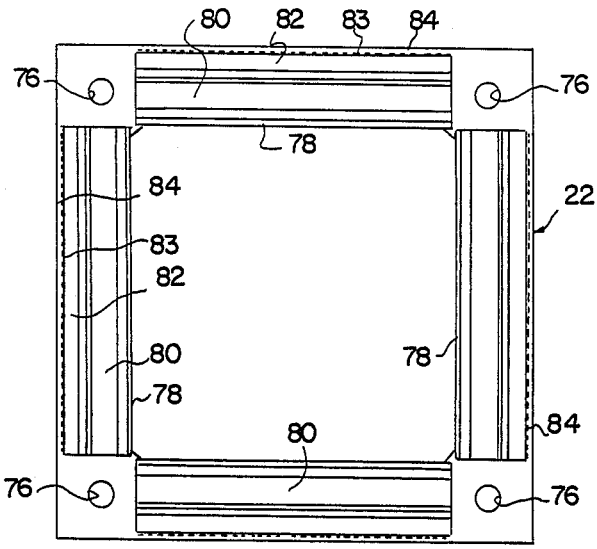

FIG. 9A shows a top plan view of module base plate 22 and FIG. 9B shows a bottom plan view of plate 22. The overall size of the module base plate 22 is about four inches by about four inches square and it is 0.150 inch thick. In each of the four corners of the module base plate is a 0.206 inch diameter clearance hole 76 that fits down over a backer plate clamp post 36. The square opening in the center of the module base plate 22 is 2.7 inches by 2.7 inches with a small chamfer in each corner. Slightly outboard of each chamfer in each corner is a 0.094 inch diameter module alignment post 70 that fits into a corner hole 48 in module 10. Along each of the four inside edges of this square opening in the middle of the module base plate 22 is recess 74 into which a silicone foam strip 32 fits. When the module 10 is compressed down onto the module base plate 22, strip 32 is compressed and provides contact force. In the center of each of the four sides of the module base plate 22 is a shoulder post 34 which, in concert with the ramps 40 in the module clamping plate 18, is used to clamp module 10 down onto module base plate 22.

FIG. 9B is a bottom plan view of module plate 22. On each of the four sides of the bottom surface of plate 22 are the following features, going from the inboard side of the module base plate to the outboard side: assembly stop 78; mounting recess 80 for resilient wiping control return strip 26; operating cavity 82 for actuator plate 28, retaining lip 80 and assembly stop 84.

Figure 10:
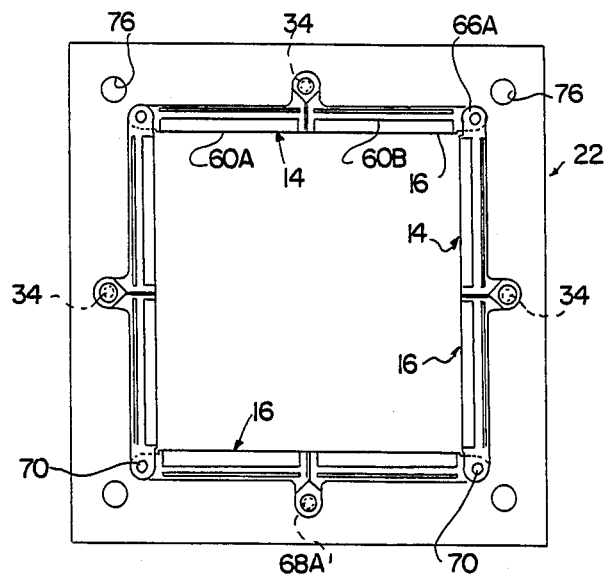
FIG. 10 is a top view of the module plate with flexible circuits of FIG. 7 attached.

FIG. 10 shows a top plan view of module base plate 22 with flex circuits 14, 16 mounted in place. Tabs with holes 66A and 66B are mounted over the module alignment posts 70, and tabs with press fit holes 68A and 68B are mounted over the module base plate shoulder posts 34, so that pairs of contact arrays 60A, 60B are fixed in end to end alignment over silicone foam strips 32.

Figure 12:
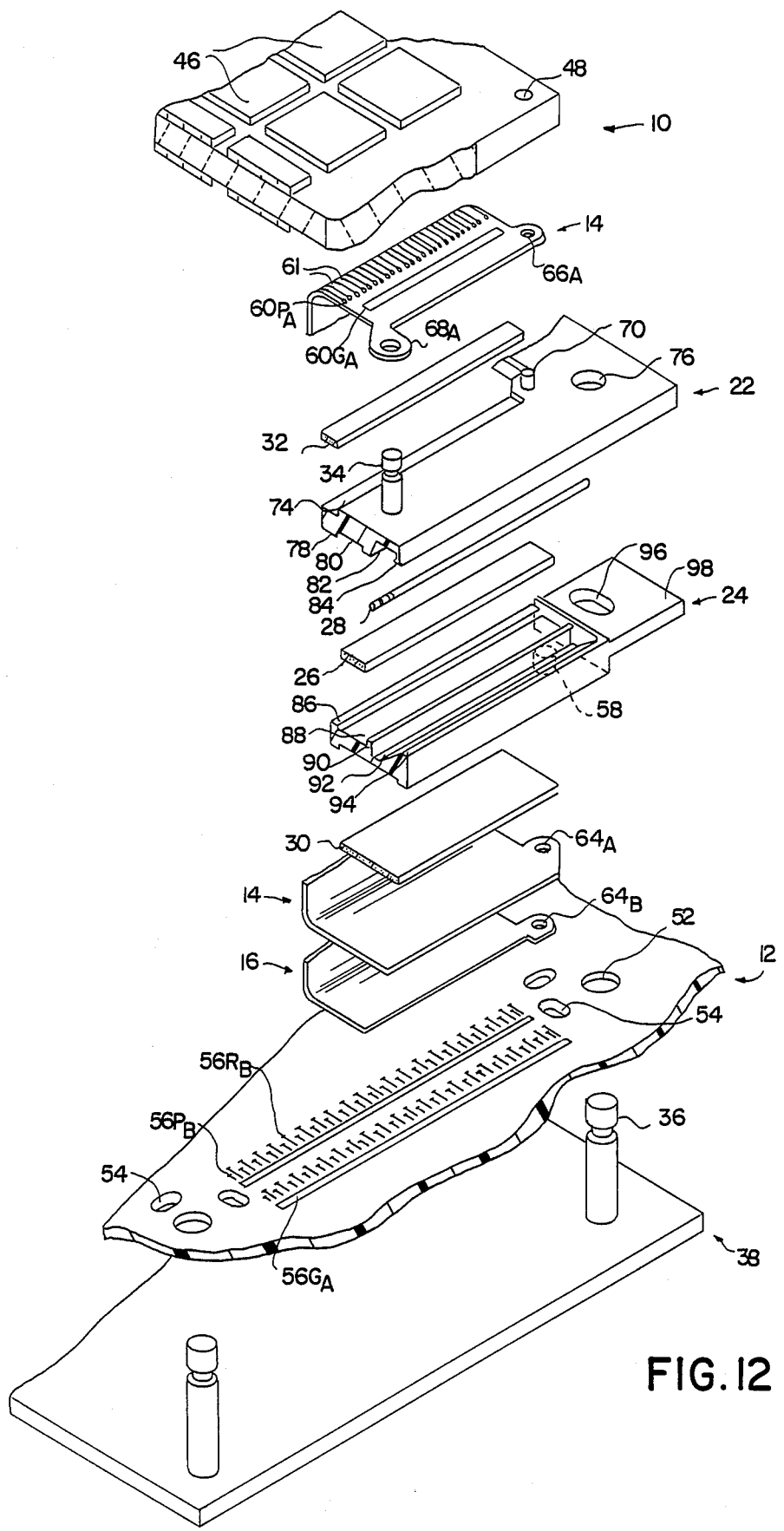
FIG. 12 is an exploded isometric view of portions of interacting components of the connector assembly of FIG. 1.

These aspects are also shown in FIG. 12, which is an exploded isometric view, showing a portion of a circuit block 24 and foam pieces 22, 26, and 30. One of these circuit blocks 24 is mounted to each of the four sides of the module base plate 22.

Each circuit block 24, as shown in FIG. 11, has the following features from the inboard side to the outboard side of the circuit block: assembly stop 86 which matches with the assembly stop 78 on the module base plate, mounting recess 88 for the foam piece 26, which lines up opposite the mounting recess 80, retaining lip 90, which retains the other end of the actuator plate 28 from retaining lip 83 in the module base plate, recess 92, an assembly stop 94 which matches with assembly stop 84 in the module base plate. These features are also shown in cross section in FIGS. 2A and 2B and in FIG. 12.

Again, referring to FIGS. 11 and 12, each end of the circuit block necks down to a smaller thickness creating tabs 98, 100. As indicated in FIG. 1, tab portion 98 overlies tab portion 100 of an adjacent circuit block. Each circuit block has a tab portion 98 on the upper side and tab 100 at the opposite end on the lower side. Tab portions 98, 100 have slots 96, which are 0.206 inch wide by 0.241 inch long, and fit over backer plate clamping posts 36 and function as a stop when the slot 96 is forced by the circuit block wiping motion up against the post 36 to fix the position of that circuit block relative to circuit board 12. The tab portion 100, at the other end of each circuit block, has a slot 102, not shown in FIG. 12, which is 0.216 inch wide by 0.241 inch long. This slot also fits over the mounting backer plate post 36, but is 0.010 inch wider to allow for location and size tolerances, so that it does not bind. One end of that slot is used as a stop to fix the radial position of that end of the circuit block relative to the post 36 in the slot 96 in the other end of the circuit block. This system is designed to generate 0.035 inch of wipe with a downward motion of the assembly of 0.040 inch. FIG. 12 also shows backer plate 38 with the shoulder mounting clamping posts 36, and the printed circuit board 12, with the holes 52 which fit over the backer plate post 36. FIG. 12 also shows in phantom, a circuit mounting post 58 of which there are two on each circuit block 24. The circuit mounting posts 58 are designed to press fit into the holes 64, 64 in the tabs of the wide ends of the flex circuits 14 and 16. The clearance slots 54 in the printed circuit board 12, also shown in FIG. 6, allow clearance for posts 58.

Figure 13:
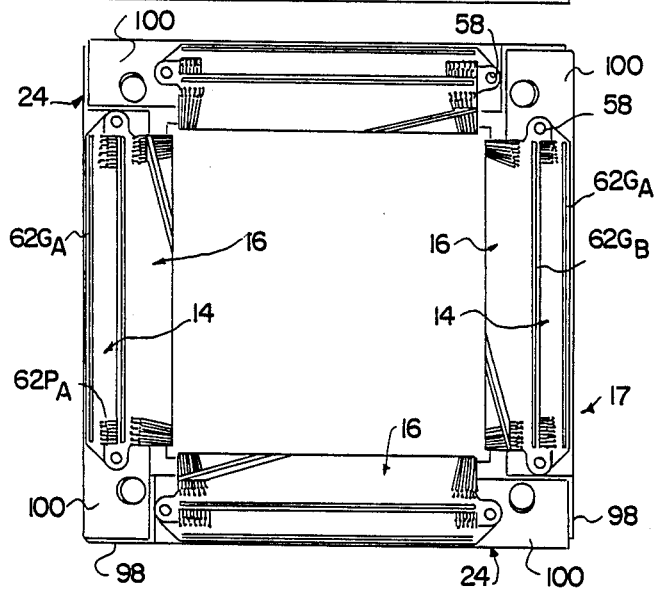
FIG. 13 is a bottom view of the subassembly of the module plate with circuit blocks and flexible circuits attached.
Figure 11A:
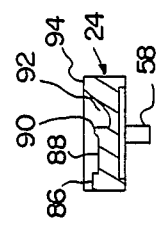
FIGS. 11A–C are top, side and bottom views of a contact block used in the connector assembly of FIG. 1.
Figure 11B:
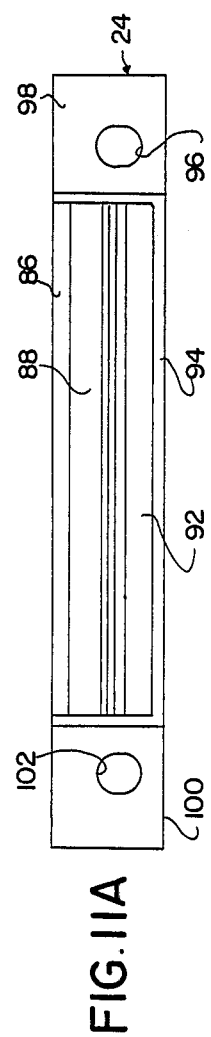
Figure 11C:
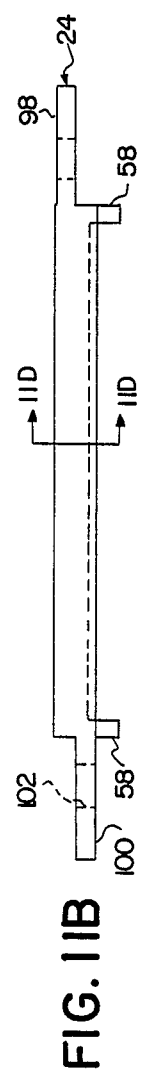
Figure 11D:
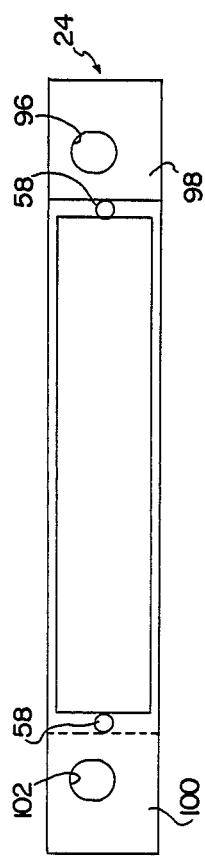
FIG. 11D is a sectional view taken along the lines 11D—11D of FIG. 11B.

FIG. 13 is a bottom view of subassembly 17 that includes module base plate 22, circuit blocks 24 and flex circuits 14 and 16, there being four circuit blocks 24, four flex circuits 14 and four flex circuits 16 in subassembly 17.

Figure 14:
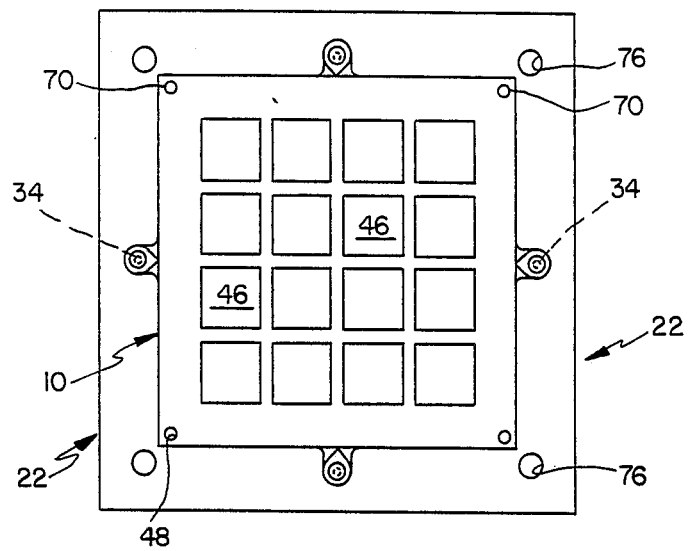
FIG. 14 is a top view of the subassembly of FIG. 13 with the multi-chip module of FIG. 4 in place.

FIG. 14 is a top view of subassembly 17 with multi chip module 10 mounted on top. Alignment holes 48 in the four corners of the multi chip module 10 are mounted over alignment posts 70 of module base plate 22.

Figure 15:
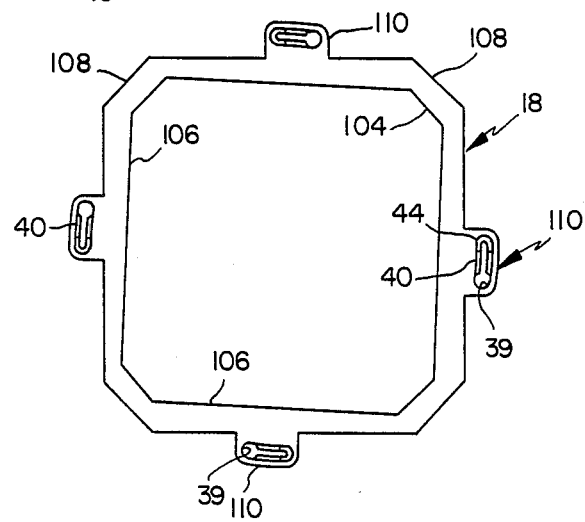
FIG. 15 is a top view of the module clamp plate used in the connector assembly of FIG 1.

FIG. 15 is a top plan view of module clamp plate 18. In the center of each side of this approximately square clamp plate is an outwardly projecting tab 110, each tab 110 containing ramp structure as shown in FIGS. 3A, B, C, and D. That structure includes opening 39 for shouldered post 34 of the module base plate 22, inclined ramp sections 40, and latch section 44, the latter in the final position, being mated against the shoulder 42 of the clamp post 34. Clamp plate 18 has an inside opening of approximately 2.5 inches square shape with beveled angle 104 at each corner, and inside edge 106 at an angle to the square to allow clearance for components 46 mounted on the multi chip module. Additionally, the outside corners of the module clamp plate 18 are beveled, along edges 108, to allow clearance for module alignment posts 70.

Figure 16:
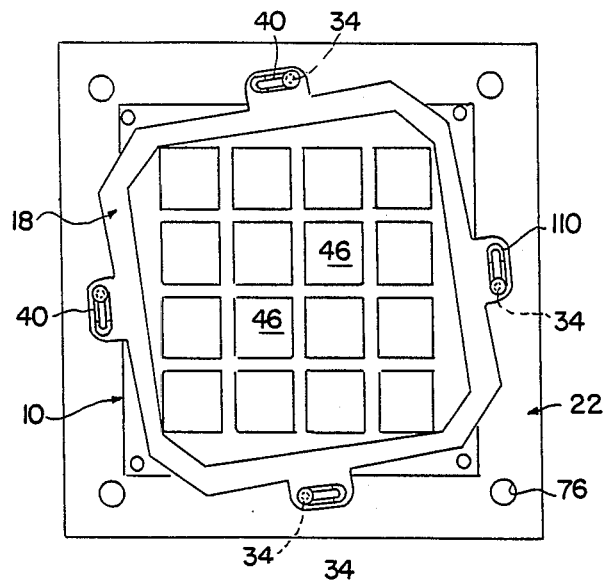
FIG. 16 is a top view similar to FIG. 14 with the module clamp plate of FIG. 15 in position on the subassembly of FIG. 14.
Figure 17:
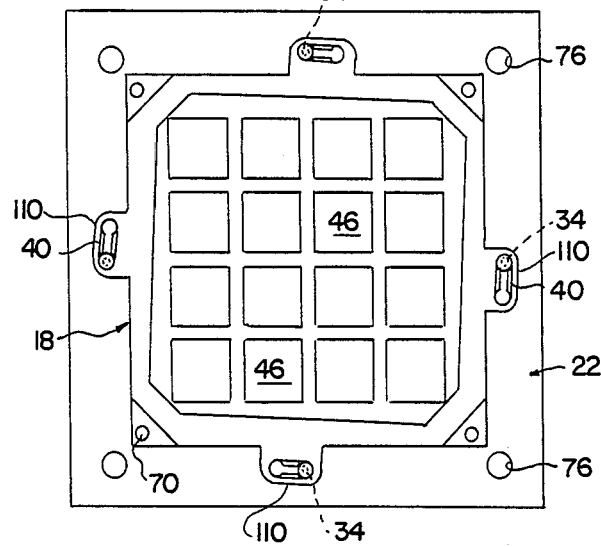
FIG. 17 is a top plan view similar to FIG. 16 with the module clamp plate in clamped position.

FIG. 16 is a top plan view with the multi chip module 10 mounted on top of the subassembly 17 and the module clamp plate 18 mounted on top of the multi chip module. in its unclamped position. FIG. 17 shows the components of FIG. 16 with plate 18 rotated into clamped position. The clamping action engages ramps 40 of clamp plate 18 with the shoulder posts 34 of base plate 22, causing downward motion of the module clamp plate 18, which presses multi chip module 10 down upon the module base plate 22, clamping the flex circuit pads 60P, 60G against corresponding pads 50P, 50G of module 10, and compressing silicone foam strip 32 so that electrical contacts between the contact arrays 50 on the bottom of multi chip module 10 and contact arrays 60 of the narrow end of the flex circuits 14, 16 are completed.

Figure 18A:
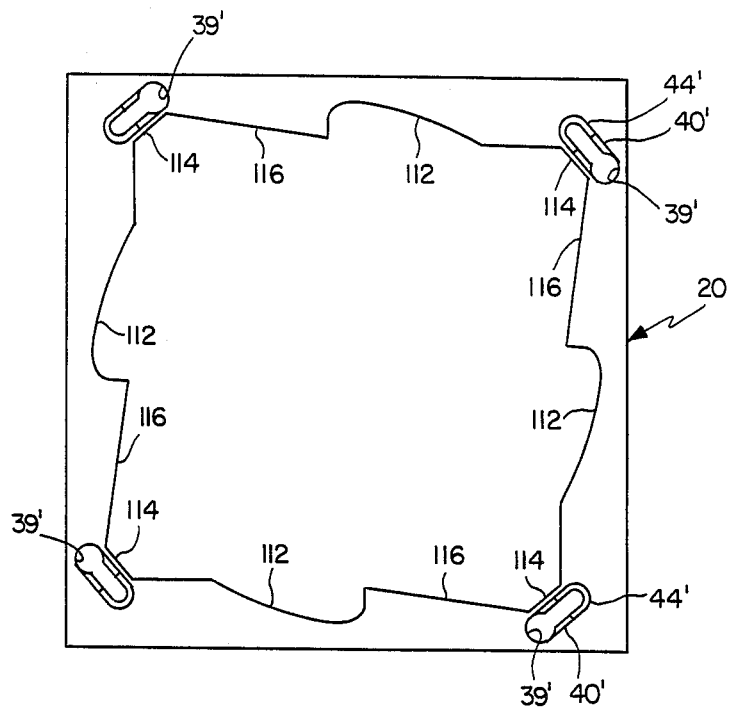
FIG. 18A is a top view of the assembly clamp plate used in the connector assembly of FIG. 1.

FIG. 18A is a top plan view of the assembly clamp plate 20. In each of the four corners of the assembly clamp plate are the slotted ramp structures of the type shown in FIGS. 3A, B, C, and D. Each hole 39' fits over a backer plate mounting post 36, and has a ramp section 40', which engages the shoulder 42 of the backer plate post 36. There is also a latch section 44' which is the final mating surface between the assembly clamp plate 20 and the shoulder portion 42' of post 36. The inside opening of the assembly clamp plate is approximately square, with a curved relieved section 112 in the center of each side which provides space to accommodate the projecting tab portion 110 of the module clamp plate 18. In addition, when the assembly plant plate is in position, recess 112 restricts rotation of the module clamp plate 18 to prevent demating. Assembly clamp plate 20 also has a bevelled portion 114 in each corner, and an angled side portion 116 for clearance around corners of multi-chip module 10.

Figure 19:
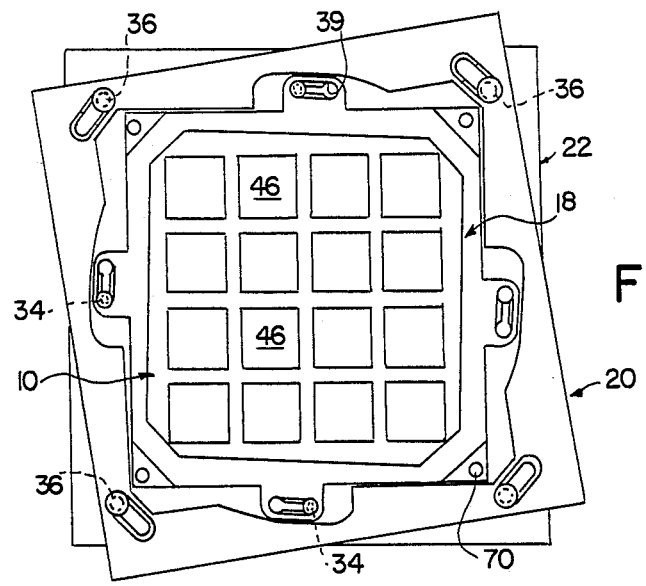
FIG. 19 is a top view of the entire connector assembly with the assembly clamp plate in unclamped position.

FIG. 19 shows in top plan view, the entire assembly in position to be clamped to printed circuit board 12 with backer plate 38, subassembly 17 mounted over assembly mounting posts 36, module 10 having been connected by module clamping plate 18, and assembly clamp plate 20, in position on top of subassembly 17, fitting over mounting posts 36.

Figure 20:
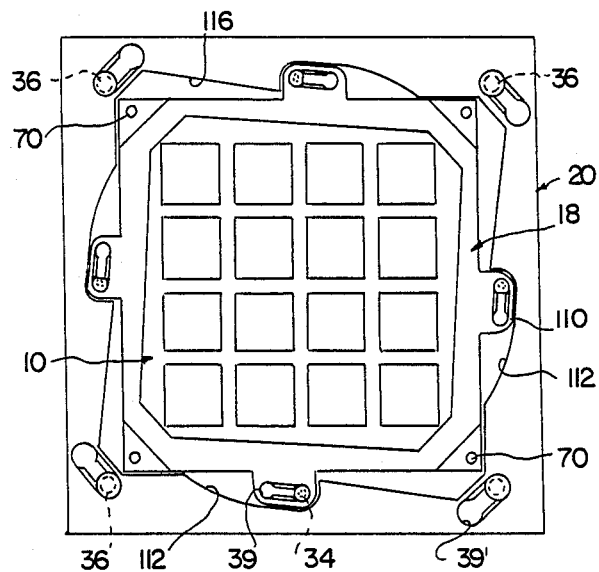
FIG. 20 shows the connector assembly with the assembly clamp plate in clamped position.

FIG. 20 shows the entire assembly in clamped position. When subassembly 17 is to be clamped to the printed circuit board 12 using the assembly clamp plate 20, as assembly clamp plate 20 is rotated, mounting posts 36 in backup plate 38 are engaged. This engagement produces a downward motion of the assembly clamp plate 20, which in turn presses down and causes downward motion of module base plate 22, of about 0.060 inch.

With reference to FIGS. 2A and 2B, as the assembly clamp plate 20 moves downward, module base plate 22 is pressed towards printed circuit board 10, causing pinless hinge actuator members 28 to press against the circuit blocks 24, causing the circuit blocks 24 to move sideways in wiping actions across the surface of the printed wiring board 12. At the same time that the actuator member 28 is moving, silicone foam strip 26 is both compressed and stressed under shear. This creates and controls the downward force during the wiping motion and creates a return force so that when the system is demated, the components return to their original unclamped position. In addition, shown in FIGS. 2A and 2B is the relationship of the silicone foam 30 which is used to create the contact force on the printed wiring board. As the system is compressed, the foam strip 30 is compressed and generates contact force.

At the end of this downward motion of module clamp plate 22, the circuit blocks 24 have been moved inward about 0.035 inch and the assembly stop surfaces 86 an 78, are in contact, as are assembly stop surfaces 94 and 84. At this time elastomer strip 30 has been compressed 0.040 inch, thus making wipe connections between flex circuits 14 and 16 and printed circuit board 12.

The motion of circuit blocks 24 relative to module plate 22 can be controlled during wipe by varying certain parameters. Among these are the physical properties and geometries of foam members 26 and 30. Upon completion of wipe, elastomer member 26 is under shear stress. When circuit blocks 24 are released by rotating assembly clamp plate 20 to the pre-clamp position of FIG. 19, the circuit blocks 24 are returned by release of the shear stress to their preclamped position. The amount of wipe and the force vs. wipe profile can also be varied by varying the geometry and angle of the actuator mechanism previously described.

To describe more fully the generation of wiping motion during the clamping action, as the module base plate 22 is forced downward by the downward motion of assembly clamp plate 20, module base plate 22 is held rigidly in lateral position by the four backer plate clamp posts 36. The actuator member 28, which is rigid, is held at one end by retaining lip 83 in the module base plate 22, and by retaining lip 90 in the circuit block 24 at the other end. Circuit block 24 is free to move laterally, under the restraint of silicone foam mounting member 26. Lateral motion of circuit block 24 creates resilient shear stress on the silicone foam member 26. In consequence, as the module base plate 22 moves downward, the rigid actuator member 28 is caused to rotate. Since the module base plate 22 is rigidly restrained in the horizontal axis, this rotation of rigid pinless hinge member 28 causes circuit block 24 to move laterally.

The flexible circuits extend from the perimeter of the multi-chip module inwardly and then extend outwardly to the perimeter of the contact pads on the surface of the circuit board; and the circuit blocks are moved inwardly towards the center of the assembly by the wiping action.

The unitary clamp member with the slotted ramp arrangement provides a mechanically simple arrangement that allows quick and easy mating and demating of the components. Such unitary clamp member may move in straight line movement, but in preferred embodiments is rotated such that the clamp plate provides simultaneous downward forces on the surfaces of the hardware assembly which is to be clamped.

The connector arrangement permit a number of elements to control the amount of wipe and contact force generate as a function of wiping movement, such that the system may be designed for various specific applications and needs.

Figure 21A:
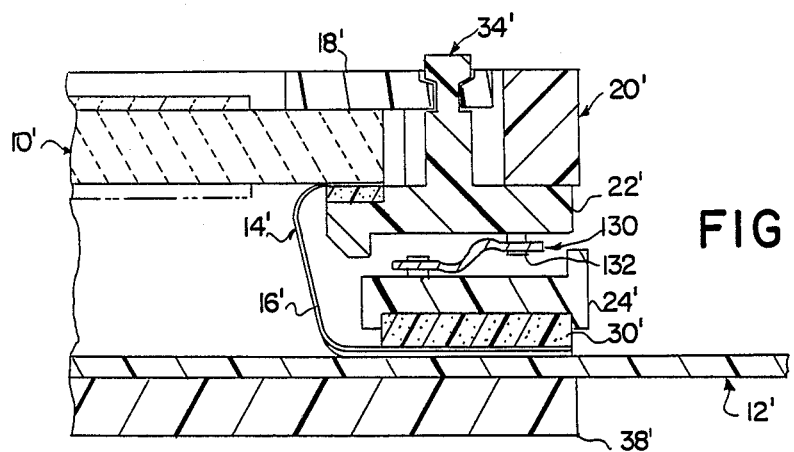
FIGS. 21A and 21B are cross sectional views similar to FIGS. 2A and 2B showing another connector assembly embodiment.
Figure 21B:
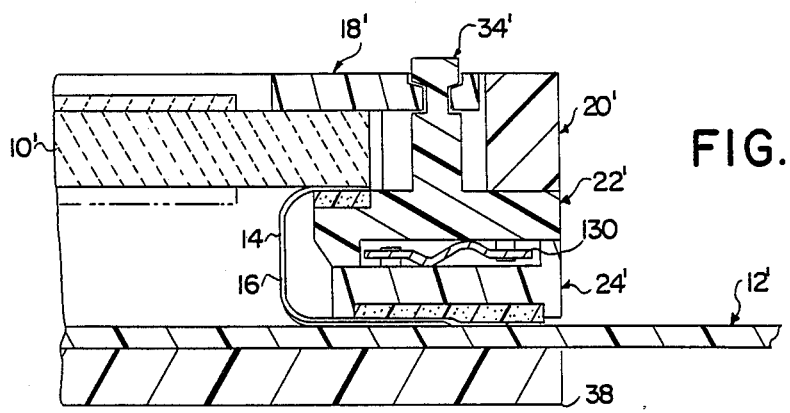

Another embodiment is shown in FIGS. 21A and 21B, that embodiment employs a leaf spring member 130 that extends between post 132 on module plate 22' and post 134 of contact lock 24'. As module plate 22' is forced downwardly by the action of assembly clamp plate 20', its lateral movement is restricted. As leaf spring 130 is compressed, it tends to elongate. As contact block 24' is free to move laterally, as controlled by the leaf spring 130, there is wiping action on the pressure-mated contact pads of flex circuits 14', 16', and the engaged contact pads 56 of circuit board 12'.

The physical properties of leaf spring 130 can be varied as desired to vary the amount of force transmitted to the circuit block 24 by the module plate 21' to vary the force versus wipe profile.

Figure 22A:
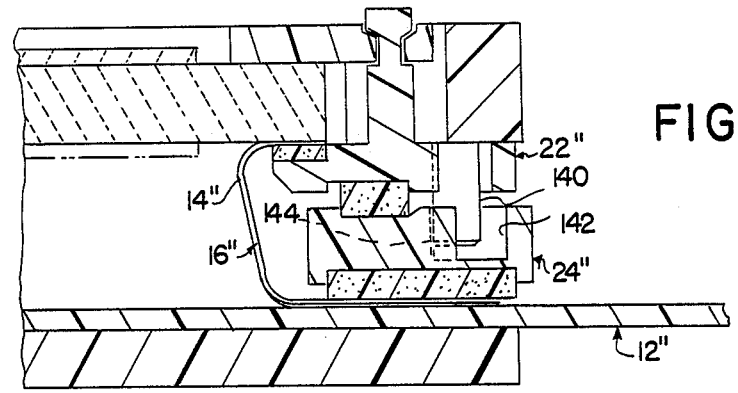
FIGS. 22A and 22B are cross sectional views similar to FIGS. 2A and 2B showing still another connector assembly embodiment.
Figure 22B:
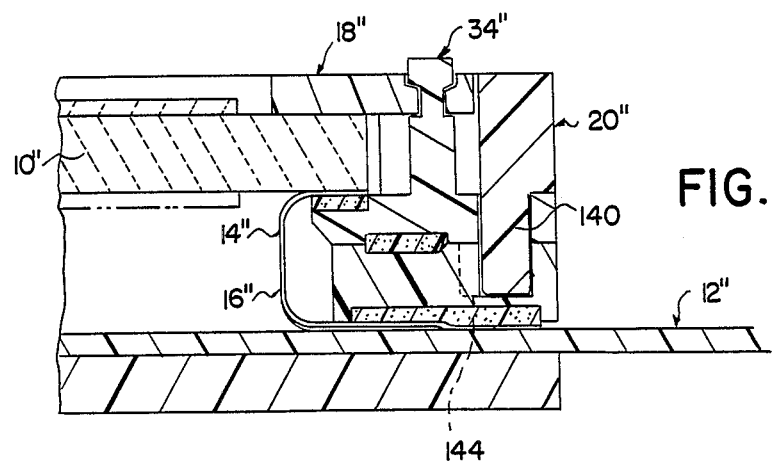

Still another embodiment is shown in FIGS. 22A and 22B, again similar to FIGS. 2A and 2B showing the connector assembly in unclamped position and clamped position. In this embodiment, cam post 140 extends downwardly from clamp ring 20" with its lower end received in camming slot 142 of contact block 24". That groove 142 is elongated and has upstanding surface 144 against which the edge of camming post 140 bears. As clamp plate 20 is rotated, and the interaction of posts 36" and slots 35" forces the module base plate 22" downwardly, the cam posts 140 move along cam grooves 142, camming the circuit block 24" inwardly causing wiping interaction between contact pads on flex circuits 14", 16" and contact pads on circuit board 12". In still another embodiment, the posts 140 could be integral with contact block 24" and engaged in a camming groove in clamp plate 20".

Figure 18B:
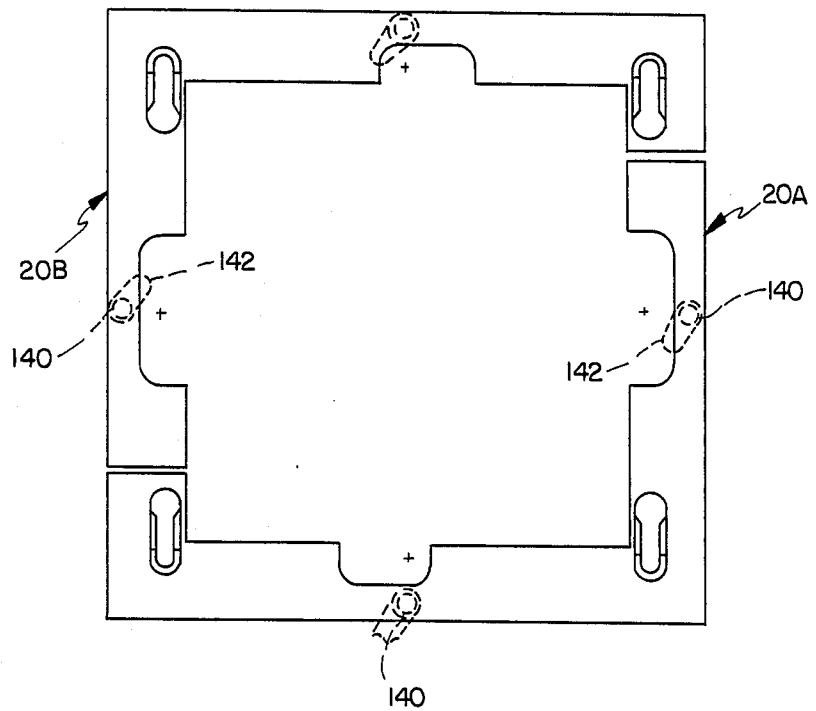
FIG. 18B is a top view of modified assembly clamp plate structure for use in connection with the connector assembly embodiment shown in FIGS. 22A and 22B.

FIG. 18B shows assembly clamp plate structure 20" suitable for use in a modified embodiment in which two clamp plate structures 20A and 20B are employed, each structure including two depending cam posts 140 that cooperate with camming slots 142.

The connection system provides a high density, electrically superior interconnection to both the module 10 and to the printed circuit board 12. The use of flex circuits 14, 16 with fluoropolymer materials provides excellent high frequency electrical performance. The pressure-mated pad connection between flex circuits 14, 16 and multi-chip module 10 printed circuit 12 provides electrically superior interconnection that does not produce significant electrical discontinuities even at high frequencies.

The disclosed embodiments provide a dense interconnection, in terms of number of signals per area consumed, on the surface of multi-chip module 10. They also have the advantage of being a simple connection to mate and de-mate. As it does not involve solder, the risk of heating the interface when mating or de-mating the connection is not involved and those components may be separated easily for repair or component replacement. In a particular embodiment, the ground connection for the flex circuit is located on the outboard side of the module, simplifying routing of the signal contacts by permitting the rows of contact pads to be on the inboard side of the module from the ground connection. The embodiment permits close contact spacing, e.g., contacts on 0.012 inch centers, so eight hundred signal contacts can easily be provided on a 3-inch by 3-inch module, leaving approximately a 2-½-inch square central space for mounting chips or other components on both the top and the bottom surfaces of the module. By this arrangement only a very small percentage of the total area of the module is consumed by the connection system.

The preferred embodiment provides a non-wiping pressure mated pad connection on module 10. In most cases, a wiping connection is not needed at the module end because such modules are generally tested and repaired, if necessary, or inspected in a clean room environment. A wiping connection could be provided at the module end for the high density contacts where desired.

For field replacement of modules for repair, inspection, or upgrade to higher performance, however, the wiping connection of the disclosed embodiment is desirable from an environmental standpoint. The system provides the wiping contact on the printed circuit board which is also easily matable-dematable without solder and also provides a dense connection in terms of number of signals per area taken up on the board. While the contact density on the board is less than on the module the density capabilities on the circuit end and on the module end match well with presently existing manufacturing capabilities. For a three-by-three inch module in this preferred embodiment, a square space approximately 2-½ inches per side is available on each side of the module for other components besides the connection, while still providing eight hundred contacts (290 contacts per square inch of module surface area). On the circuit board, free space is provided in the center section beneath the module, available for other components, and the contact density is about 80 contacts per square inch. The orientation of the flexible circuits is inward and then from the multichip module to the surface of the circuit board, and the circuit blocks move inward towards the center of the assembly during wiping action.

The slotted ramp mechanism for providing clamping force has the advantages of being very simple mechanically and allowing quick and easy mate and demate of the components, whether by the rotating movement in the preferred embodiment or in lateral or other clamping plate member movements. The plate preferably provides simultaneous downward force on the entire surface of the hardware assembly which is clamped.

The wiping mechanism allows a number of elements to control the amount of wipe, and the contact force generated as a function of the wiping movement, which allows the system to be easily accommodated to various specific applications and needs. The silicone foam material has high stress retention even at elevated temperatures. Other components such as the clamping plates, the circuit blocks, the module base plate, and the actuator hinge, are preferably molded compounds for cost savings and weight considerations, although machined metal may be used. Preferably, these are formed of glass-reinforced phenolic, molded into the required shapes. In most cases, the multi-chip module is a multi-layer ceramic material, and the printed circuit board is a multi-layer epoxy-glass board or a multi-layer fluoropolymer board. The flexible circuits preferably include a fluoropolymer material such as Rogers RO2500 for its high frequency and lack of water absorption advantages, and are of controlled impedance to match the impedance of the module and the board assembly.

Many other embodiments are feasible and have particular advantage in certain circumstances. In many cases, the high density connection system will employ a multilayer circuit board 12, as discussed. Frequently, it will be o such a large number of layers that its thickness and rigidity is sufficient to provide the needed rigidity of the system. In such cases a backer plate may be unnecessary; the assembly backer plate clamp posts being mounted directly into the printed circuit board.

Another advantage of the present system is the elimination of separate stops for each of the circuit blocks 24. Each fixed corner post 36 stops the ends of the two overlapping circuit blocks, reducing the number of hardware parts.

In many cases, it is desirable to glue the flex circuits 14, 16 onto the silicone foam pieces 32 and 30 and to glue the silicone foam pieces into the recesses in which they fit. In such cases, the press fit tabs are used simply for alignment and are not required to continually hold the circuits in place.

While a particular embodiment of the invention has been shown and described, various modifications thereof will be apparent to those skilled in the art, and therefore it is not intended that the invention be limited to the disclosed embodiment, or to details thereof, and departures may be made therefrom within the spirit and scope of the invention.

What is claimed is:

1. For use in an electrical connector system for electrically interconnecting electrically conductive paths of a first circuit which has a first array of pad-type contacts with corresponding electrically conductive paths of a second circuit, a connector subassembly comprising frame structure that includes a drive portion, contact carrier structure adapted to receive a second circuit which has a second array of pad-type contacts corresponding to the pad-type contacts of said first array and that includes a driven portion, actuator mechanism disposed between said drive and driven portions for moving said contact carrier structure laterally from a first location to a second location in response to movement of said frame structure toward said contact carrier structure, resilient structure interconnecting said frame structure and said contact carrier structure in a manner allowing guided movement of said frame structure towards said contact carrier structure and creating a return force to return said contact carrier structure laterally toward said first location in response to movement of said frame structure away from said contact carrier structure, first guide structure associated with said frame structure for allowing said guided movement of said frame structure towards said contact carrier structure such that said actuator mechanism increases the lateral spacing between said drive and driven portions, and second guide structure associated with said contact carrier structure and allowing translational movement of said contact carrier structure relative to said frame structure while maintaining the pad-type contacts of said first and second circuits in alignment to produce said lateral movement of said contact carrier structure in a direction parallel to the plane of said pad-type contacts in wiping action as guided by said second guide structure.

2. The connector subassembly of claim 1 wherein said actuator mechanism includes a rigid plate member.

3. The connector subassembly of claim 1 wherein said actuator mechanism includes a resilient spring member that is disposed between said drive and driven portions.

4. The connector subassembly of claim 1 wherein said frame structure and said contact carrier structure each include a recess, and said actuator mechanism includes a member that has one end disposed in the recess in said frame structure and its opposite end disposed in the recess in said contact carrier structure.

5. The connector subassembly of claim 4 wherein said actuator mechanism includes a rigid plate member that is disposed between said drive and driven portions.

6. The connector subassembly of claim 3 wherein said resilient structure includes an elastomeric member that couples said frame structure and said contact carrier structure together.

7. The connector subassembly of claim 1 wherein said subassembly includes a plurality of said contact carrier structures, said contact carrier structures being arranged about a central area, and further including common clamp structure operable, with respective ones of the pad type contacts of said first and second arrays in face to face engagement, to move said plurality of contact carrier structures inwardly towards said central area in wiping actions.

8. The connector subassembly of claim 7 wherein said second circuit is of transmission line type and includes a plurality of conductor traces with terminal pads at one end spaced less than one hundred mils on center, and at least one ground plane, said conductor braces having the same characteristic impedance and being impedance matched to circuits being interconnected by said second circuit.

9. The connector subassembly of claim 8 wherein said resilient structure is of foam-type material that has a density in the range of 2–50 pounds per cubic inch, and an air or cell volume in the range of about 25–95 percent, said foam-type material having a compression set, tested by ASTM Test Standard D3574 of less than ten percent compression set after 22 hours at 158° F. at 50 percent compression with one half hour recovery.

10. The connector system of claim 9 wherein said foam-type material is selected from the group consisting of urethanes, silicones, natural rubbers, copolymers of butadiene-styrene, butadiene-acrylonitrile, butadiene-isobutylene, chloroprene polymers, polysulfide polymers, plasticized vinyl chloride, and acetate polymers and copolymers.

11. The connector subassembly of claim 10 wherein said foam-type material is in sheet form and has a thickness of less than one half centimeter.

12. The connector subassembly of claim 11 wherein said foam-type material is bonded to and interconnects said contact carrier structure and said frame structure.

13. A high frequency electrical connector system for electriclly interconnecting an integrated circuit chip unit having a plurality of planar arrays of first contact pads arranged in a first pattern of peripheral form with a circuit board having a plurality of planar arrays of second contact pads arranged n a second pattern of peripheral form comprising a module member on which said integrated circuit chip unit is disposed, a plurality of multi-conductor flexible circuit structures that extend between respective portions of said first and second peripheral patterns, each said flexible circuit structure having one ends of its conductors disposed on said module member and electrically connected to respective contact pads of said integrated circuit chip u nit and contact pads at the other ends of its conductors for electrical connection to corresponding contact pads of said circuit board, each said flexible circuit structure being disposed within the interior of said connector system in an inwardly bowed configuration in which the flexible circuit structure extends from the respective ends inwardly from said peripheral patterns, a plurality of rigid nonconductive contact carrier structures, the other ends of each said flexible circuit structure being secured to a corresponding contact carrier member, each said carrier structure including a driven portion, a plurality of actuator portions for cooperation with said driven portions, means resiliently coupling said module member to said carrier structures with said actuator portions adjacent said driven portions, and unitary clamp structure operable, with respective ones of said contact pad arrays of said flexible circuit structures and said circuit board in face-to-face engagement, to move said module member towards said circuit board in clamping movement, said clamping movement causing the interaction of said actuator mechanisms and said driven portions to produce lateral movements of said contact carrier structures inwardly relative to the peripheral pattern on said circuit board during said wiping actions in directions parallel to the planes of the contact arrays of said flexible circuits and circuit board in wiping actions.

14. The connector system of claim 13 wherein the pad arrays on said flexible circuit structures include a ground plane pad and an array of pads for signal traces, the ground plane pads being closer to the ends of said flexible circuit structures thereby to correspond to the exterior of the peripheral patterns of contacts.

15. The connector system of claim 13 wherein each said flexible circuit structure is of transmission line type and include a plurality of conductor traces with signal trace pads at one end spaced less than one hundred mils o n center, and at least one ground plane pad, said conductor traces having the same characteristic impedance and being impedance matched to circuits being interconnected by said flexible circuit structures.

16. The connector system of claim 13 wherein each said actuator portion includes a rigid plate member.

17. The connector system of claim 13 wherein each said actuator portion includes a plurality of resilient spring members that are disposed between said module member and said carrier structures.

18. The connector system of claim 13 wherein said module member and said contact carrier structures each include a recess, and each said actuator portion includes a member that has one end disposed in the recess in said module member and its opposite end disposed in the recess in a said contact carrier structure.

19. The connector system of claim 13 wherein each said actuator portion includes a camming member integral with said clamp structure and a cooperating portion integral with said contact carrier structure.

20. The connector system of claim 13 wherein said resilient structure includes elastomeric members that couples said module member and said contact carrier structures together.

21. The connector system of claim 20 wherein each of said elastomeric members is of foam-type material that has a density in the range of 2–50 pounds per cubic inch, and an air or cell volume in the range of about 25–95 percent, said foam-type material having a compression set, tested by ASTM Test Standard D3574 of less than ten percent compression set after 22 hours at 158° F. at 50 percent compression with one half hour recovery.

22. The connector system of claim 20 wherein the pad arrays on said flexible circuit structures include a ground plane pad and an array of pads for signal traces, the ground plane pads being closer to the ends of said flexible circuit structures thereby to correspond to the exterior of the peripheral patterns of contacts.

23. The connector system of claim 22 wherein each said flexible circuit structure is of transmission line type and includes a plurality of conductor traces with signal trace pads at one end spaced less than one hundred mils on center, and at least one ground plane pad, said conductor traces having the same characteristic impedance and being impedance matched to circuits being interconnected by said flexible circuit structures.

24. In a high frequency electrical connector system for electrically interconnecting an integrated circuit chip unit having a plurality of planar arrays of first contacts arranged in a first pattern with a circuit board having a plurality of planar arrays of second contacts arranged in a second pattern, each pattern being of peripheral form, said connector system comprising a module member adapted to support said integrated circuit chip unit generally over the pattern of said circuit board, a plurality of multi-conductor flexible circuit structures extending between respective portions of said first and second peripheral patterns, each said flexible circuit structure having one end of its conductors disposed on said module member for electrical connection to respective contacts of said integrated circuit chip unit and contact pads at the other end of its conductors for electrical connection to corresponding contact pads of said circuit board, and a plurality of rigid nonconductive contact carrier structures, said other ends of each said flexible circuit structure being secured to a corresponding contact carrier structure, and a device for causing lateral movement relative to the circuit board of each of said contact carrier structures while the contact pads of its associated flexible circuit are pressed against the corresponding contact pads of said circuit board to produce wiping therebetween during connecting motion, the improvement wherein the interior of said connector system is configured to receive said flexible circuit structures, and each of said flexible circuit structures is disposed within the interior of said connector system in an inwardly bowed configuration in which the flexible circuit structure extends from its respective ends inwardly from the peripheral patterns on said module member and said circuit board to a joining central portion of said flexible circuit structure.

25. The connector system of claim 26 wherein said device is adapted to move said contact carrier structures inwardly relative to the peripheral pattern on said circuit board during said wiping motion, enabling free ends of said flexible circuit structures to trail during said wiping action.

26. The connector system of claim 24 in which the contact arrays on respective ends of said flexible circuit structure, for mating with said module member and said circuit board, include contact means for a ground plane and an array of contacts for signal traces, the ground plane contact means being closest to the ends of said flexible circuit structure thereby to correspond to the exterior of the peripheral pattern of contacts on said module member and said circuit board.

27. The connector system of claim 26 wherein the contacts on the end of each flexible circuit structure corresponding to said module member comprise pads adapted to make pressure contact with pads on said module member, said connector system including a device for establishing pressure engagement between said pads.

28. The connector system of claim 27 wherein said device for establishing pressure engagement with said pads on said module member comprise a rotary member adapted by interaction with inclined ramp surfaces to press said module member and the corresponding end of the flexible circuit structures together, said system also including a second rotating plate adapted to serve as driving member for causing said wiping movement of each of said contact carrier structures.

29. The connector system of claim 24 wherein, for at least two of said rigid contact carrier structures disposed at an angle to one another, a drive member adapted to be displaced in a plane parallel to said circuit board and a driven assembly responsive to the motion of said drive member, to (a) pres at least said two of said rigid contact carrier structures toward said circuit board to exert pressure between the contacts on the respective flexible circuit structures and the mating contacts on said circuit board, and (b) move said rigid contact carrier structures laterally relative to the circuit board, thereby to produce wiping action between the corresponding contact pads.

30. A high frequency electrical connector system for electrically interconnecting an integrated circuit chip unit having a plurality of planar arrays of first contacts arranged in a first pattern with a circuit board having a plurality of planar arrays of second contacts arranged in a second pattern, said connector system comprising a module member adapted to support said integrated circuit chip unit, a plurality of multi-conductor flexible circuit structures extending between respective portions of said first and second patterns, each said flexible circuit structure having one end of its conductors disposed on said module member for electrical connection to respective contacts of said integrated circuit chip unit and contact pads at the other end of its conductors for electrical connection to corresponding contact pads of said circuit board, and a plurality of rigid nonconductive contact carrier structures, said other ends of each said flexible circuit structure being secured to a corresponding contact carrier structure, an actuator mechanisms disposed between said module member and contact carrier structures for moving said contact carrier structures laterally from a first location to a second location in response to movement of said module member toward said contact carrier structures, resilient structure interconnecting said module member and said contact carrier structures in a manner allowing guided movement of said module member towards said contact carrier structures and creating return forces to return said contact carrier structures laterally toward said first location in response to movement of said module member away from said contact carrier structures, and a clamping device for causing movement relative to the circuit board of each said contact carrier structures while the contact pads of it associated flexible circuit are pressed against the corresponding contact pads of said circuit board to produce wiping therebetween during connecting motion, said clamping device comprising, for at least two of said rigid contact carrier structure disposed at an angle to one another, a drive member adapted to be displaced in a plane parallel to said circuit board to cause said actuator mechanisms, in response to the motion of said drive member, to (a) press said at least two said rigid contact carrier structures toward said circuit board to exert pressure between the contacts on the respective flexible circuit structures and the mating contacts on said circuit board, and (b) concurrently move said at least two of said rigid contact carrier structures laterally relative to the circuit board from their first locations towards their second locations, thereby to produce wiping action between the corresponding contact pads.

31. The connector system of claim 30 wherein each said pattern is of peripheral form, said flexible circuit structures extend between respective portions of said first and second peripheral patterns, each said flexible circuit structure is disposed within the interior of said connector system in an inwardly bowed configuration in which the flexible circuit structure extends from the respective ends inwardly from said peripheral patterns, and said device is adapted to move said contact carrier structures inwardly relative to the peripheral pattern on said circuit board during said wiping actions.

32. The connector system of claim 29 or 30 wherein said drive member is adapted to be displaced by rotation in said plane parallel to said circuit board 33. The connector system of claim 32 wherein an actuator mechanism is associated with each of said rigid contact carrier structures, said actuator mechanism being responsive to motion of said drive member to displace said rigid contact carrier structures.

34. The connector system of claim 32 including a cam follower associated with each of said rigid contact carrier structures engaged with a camming surface on said rotating plate, for driving said rigid contact carrier structures in their lateral motion.

35. The connector system of claim 32 in which said rotating plate presses said rigid contact carrier structures against said circuit board.

36. The connector system of claims 29 or 30 in which said drive member is arranged for rectilinear drive motion.

* * * * *

UNITED STATES PATENT AND TRADEMARK OFFICE
CERTIFICATE OF CORRECTION

PATENT NO. : 4,830,623

DATED : May 16, 1989

INVENTOR(S) : Owens et al

Page 1 of 2

It is certified that error appears in the above-identified patent and that said Letters Patent is hereby corrected as shown below:

```
Col. 1, line 14, insert --.-- after "formance".
Col. 2, line 27, "carrie" should be --carrier--.
Col 3, line 44, "alone" should be --along--.
Col. 5, line 59, "1" should be --18--.
Col. 5, line 63, "40. 42" should be --40, 42--.
Col. 6, line 4, "4" should be --48--.
Col.7, line 46, "80" should be --83--.
Col. 7, lne 56, "22" should be --32--.
Col. 7, line 67, "an" should be --and--.
Col. 8, line 31, "64, 64" should be --64, 64'--.
Col. 9, line 64, "an" should be --and--.
Col. 10, line 46, "generate" should be --generated--.
Col. 10, line 49, "21A and 21B" should be --21A and 21B--. (bold type)
Col. 10, line 59, "56" should be --56'--.
Col. 12, line 46, "be o" should be --be of--.
Col. 14, line 5, "braces" should be --traces--.
Col. 14, line 35, "arranged n" should be --arranged in--.
```

UNITED STATES PATENT AND TRADEMARK OFFICE
CERTIFICATE OF CORRECTION

PATENT NO.  : 4,830,623

DATED       : May 16, 1989

INVENTOR(S) : Owens et al

It is certified that error appears in the above-identified patent and that said Letters Patent is hereby corrected as shown below:

Col. 14, line 45, "u nit" should be --unit--.
Col. 15, line 19, "o n" should be --on--.
Col. 16, line 37, "26" should be --24--.
Col. 17, line 35, delete "an".
Col. 18, line 1, "it" should be --its--.
Col. 18, line 6, "structure" should be --structures--.
Col. 18, line 11, insert --of--after "two".

Signed and Sealed this

Twenty-third Day of January, 1990

Attest:

JEFFREY M. SAMUELS

Attesting Officer  Acting Commissioner of Patents and Trademarks